United States Patent
Watanabe (10) Patent No.: US 6,845,040 B2
(45) Date of Patent: Jan. 18, 2005

(54) NONVOLATILE MEMORY (75) Inventor: Kenichi Watanabe, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 98 days.

(21) Appl. No.: 10/320,514

(22) Filed: Dec. 17, 2002

(65) Prior Publication Data

US 2003/0231522 A1 Dec. 18, 2003

(30) Foreign Application Priority Data

Jun. 17, 2002 (JP) ............................ 2002-176202

(51) Int. Cl.⁷ .............................................. G11C 16/04
(52) U.S. Cl. .............................. 365/185.04; 365/185.18; 365/185.29
(58) Field of Search ..................... 365/185.04, 185.18, 365/185.28, 185.29, 185.01

(56) References Cited

U.S. PATENT DOCUMENTS 5,576,987 A  * 11/1996 Ihara et al. ................. 365/149

6,651,149 B1 * 11/2003 Iwasaki ....................... 711/163

FOREIGN PATENT DOCUMENTS

| JP | 64-043897 | 2/1989 |
| JP | 10-188577 | 7/1998 |

* cited by examiner

*Primary Examiner*—Hoai V. Ho
(74) *Attorney, Agent, or Firm*—Volentine Francos & Whitt, PLLC (57) ABSTRACT

A nonvolatile memory in which a rewrite disabled region may be set freely operates whereby an address signal is decoded by a row decoder, a selected word line is set at "H", and this is transmitted to a high voltage application decoder. Information indicating whether the rewriting of a memory cell in a memory cell array is permitted or prohibited is set in a disablement information setting portion, and security signals are outputted for word line units. When a word line for which rewriting is permitted is selected, a latch inside the high voltage application decoder is set, and a high voltage for rewriting is outputted to the corresponding word line at the next rewrite timing. For word lines in which rewriting is prohibited, the latch is not set and the high voltage for rewriting is not outputted to the word lines.

9 Claims, 9 Drawing Sheets

FIG.9

NONVOLATILE MEMORY

BACKGROUND OF THE INVENTION

1. Field of the Invention

This invention relates to nonvolatile memory having a rewrite disabling function.

2. Description of Related Art

Nonvolatile memory in which stored content can be erased and rewritten, and in which stored content does not disappear even if the power source is cut is used for storing data which are updated frequently. It is also used for storing programs and constants. Particularly in small-scale systems, one of the storage regions in nonvolatile memory is often used both for storing data and also for storing programs and constants. In such a case, the storage region for programs and constants is set in a rewrite disabled state in order to prevent the accidental erasure or rewriting of data, programs, or constants stored in this region.

Conventionally, a rewrite disabling circuit used in nonvolatile memory is comprised of a circuit for judging whether an inputted address is a rewrite disabled region, and a circuit for halting the output of signals or the like necessary for erasing or writing when the inputted address is a rewrite disabled region, and thereby performs a storage region rewrite disabling function.

However, in conventional rewrite disabling circuits used in nonvolatile memory, the rewrite disabled region must be limited in advance, or a rewrite disabled region must be set for each constant block. As a result, it has been impossible to set a desired region as a rewrite disabled region at any time and in accordance with the conditions of use of the nonvolatile memory.

The present invention solves the aforementioned problems in the prior art by providing nonvolatile memory in which a rewrite disabled region can be set freely at any time.

SUMMARY OF THE INVENTION

A first aspect of this invention is nonvolatile memory comprising a decoding circuit, a memory cell array, and a high voltage application circuit and provided with a storage circuit. The high voltage application circuit comprises a latch portion, a setting portion, and an output portion. The decoding circuit selects one of a plurality of word lines by decoding an address signal. Nonvolatile memory cells for holding storage data by means of an electrical charge which is accumulated in a floating gate are provided in the memory cell array at each location of intersection between the plurality of word lines and intersecting bit lines. The high voltage application circuit supplies a high voltage during rewriting of the stored data in the memory cells. The storage circuit stores set information for each of the plurality of word lines relating to whether the memory cells connected to these word lines may be rewritten or not. The latch portion holds information for each of the plurality of word lines regarding whether or not the memory cells which are connected to these word lines are to be rewritten. When a selection signal is outputted from the decoding circuit in relation to a word line having set information in the storage circuit indicating that rewriting is permissible, the setting portion sets the information corresponding to this word line in the latch portion. The output portion supplies a high voltage to the memory cells connected to this word line in accordance with the information held in the latch portion during rewriting of the memory cells. Thus a rewrite disabled region can be set freely in word line units.

A second aspect of this invention is provided with a setting portion having the following functions in place of the aforementioned setting portion. When a selection signal is outputted from the decoding circuit in relation to a word line having information indicating that rewriting is permissible set in the storage circuit, this setting portion sets the information corresponding to this word line in the latch portion. Further, when a security write signal is applied, this setting portion sets information relating to the word line selected in the decoding circuit in the latch portion regardless of the set information in the storage circuit. Thus a rewrite disabled region can be set freely in word line units.

In a third aspect of this invention, the aforementioned storage circuit is constituted so as to be able to perform rewriting similarly to the memory cell array. To this end, nonvolatile memory cells holding the set information by means of an electrical charge accumulated in a floating gate are disposed for each of a plurality of word lines in the same region as the memory cell array. As a result, the circuit constitution is simplified and it becomes difficult to re-enable rewriting once rewrite disablement has been set, and thus security is enhanced.

A fourth aspect of this invention is nonvolatile memory comprising a decoding circuit for selecting one of a plurality of word lines by decoding an address signal, a plurality of word lines, and a plurality of source lines disposed in relation to these word lines. Nonvolatile memory cells constituted by insulated gate type field-effect transistors and used for holding storage data by means of an electrical charge accumulated in a floating gate are disposed at each location of intersection between these word lines and source lines and intersecting bit lines. This nonvolatile memory also comprises a memory cell array in which the control gates, sources, and drains of each of these memory cells are respectively connected to the corresponding word lines, source lines, and bit lines. The circuit is thus simplified. A high voltage can be divided into an erasure high voltage and a writing high voltage which are applied to the word lines and source lines respectively. As a result, bulk erasure in respect of a word line or writing to each bit of a selected word line can be freely performed.

The nonvolatile memory also comprises a storage circuit, a first switch, and a second switch. The storage circuit is provided for each of the plurality of word lines. The control gates and sources are respectively connected to the corresponding word lines and source lines. The storage circuit is constituted by nonvolatile memory cells. The nonvolatile memory cells are constituted by insulated gate type field-effect transistors which hold information as to whether rewriting is permitted or not by means of an electrical charge accumulated in a floating gate and in which the drain is connected to a security line provided in relation to a word line. The first switch is provided for each word line and on/off controls the connection between each word line and an output node corresponding to each word line by means of an erase enabling signal. The second switch is provided for each source line and on/off controls the connection between each source line and the output node corresponding to each source line by means of a write enabling signal.

The nonvolatile memory also comprises a latch circuit, a reset circuit, a setting circuit, and a high voltage output circuit provided for each word line. The latch circuit holds rewrite information for each word line. The reset circuit resets the latch circuit in accordance with a reset signal. The setting circuit sets the latch circuit corresponding to a word line selected by the selection circuit when a set signal is applied and when information indicating that rewrite is possible is stored in the memory cells of the storage circuit corresponding to this word line. The high voltage output circuit outputs a high voltage for erasure or writing to the output node corresponding to the word line for which the latch circuit is set when an erasure enabling signal or a write enabling signal is provided.

According to this invention, nonvolatile memory is constituted as described above, and thus the following operations are realized.

An address signal is decoded by a decoding circuit such that one word line is selected. Meanwhile, set information as to whether rewriting of the memory cells in each word line may be performed or not is stored in a storage circuit, and only when the set information for the selected word line indicates that rewriting is permitted is information indicating that the memory cells are to be rewritten set in the latch portion of a high voltage application portion, for example. A high voltage is supplied to the corresponding memory cells during memory cell rewriting timing only when information indicating that the memory cells are to be rewritten is set in the latch portion. Accordingly, if the storage circuit is set to rewrite disabled, the high voltage is not outputted and the memory cells are not rewritten.

BRIEF DESCRIPTION OF THE DRAWINGS

The foregoing and other objects, features and advantages of the present invention will be better understood from the following description taken in connection with the accompanying drawings, in which.

DESCRIPTION OF THE PREFERRED EMBODIMENTS

Embodiments of this invention will be described below with reference to FIGS. 1 through 9. Each drawing is either a constitutional diagram showing a constitutional example of the nonvolatile memory according to this invention, a circuit diagram, or a diagram relating to a description of the operations thereof. Note that the drawings are merely timing charts describing in outline the constitution, circuits, and operations of nonvolatile memory for the purpose of understanding this invention, and that this invention is not limited to or by the scope of these drawings. Furthermore, specific conditions and the like are used in the following description, but these conditions are merely a case in point and this invention is not limited thereby. Also note that identical constitutional components in the drawings have been allocated identical numerals and duplicate description thereof has been omitted.

First Embodiment

Figure 1:
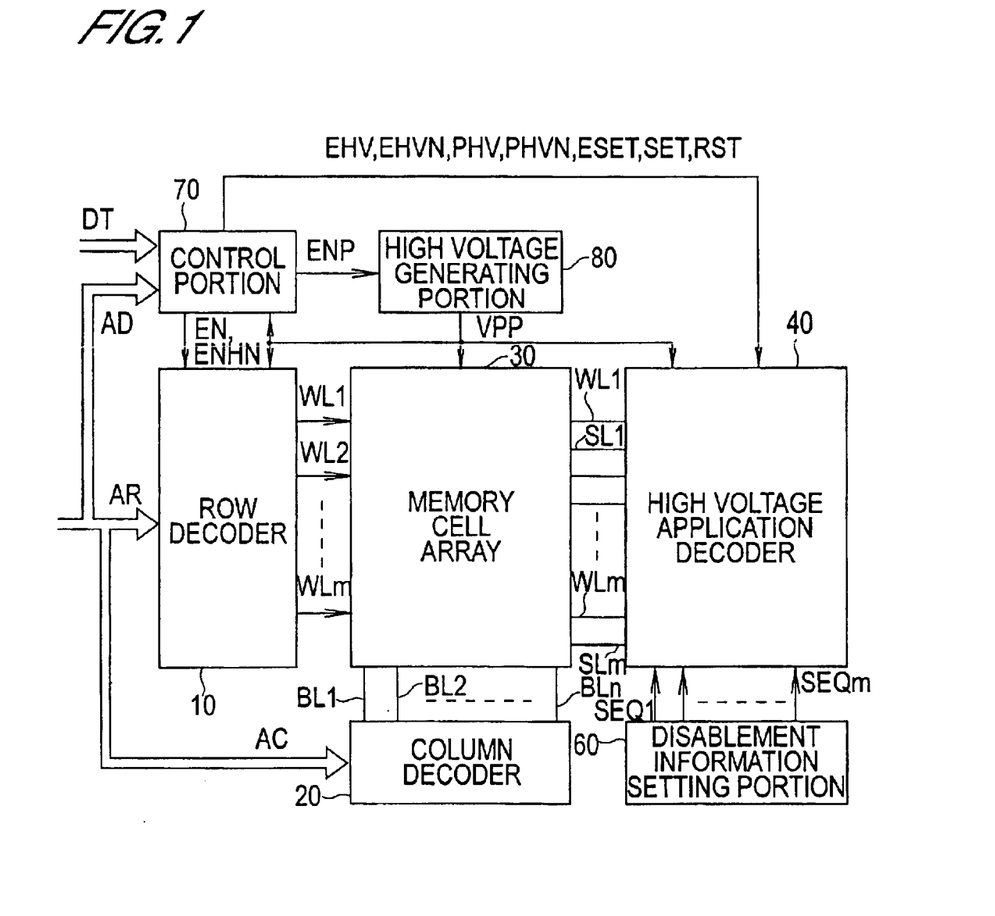
FIG. 1 is a block diagram of nonvolatile memory relating to a description of a first embodiment.

FIG. 1 is a block diagram illustrating in outline the nonvolatile memory of a first embodiment of the present invention.

This nonvolatile memory comprises a row decoder 10 to which a row address AR inside an address signal AD is provided, and a column decoder 20 to which a column address AC is provided. The row decoder 10 decodes row addresses AR to drive corresponding word lines WLi (note that i=1 to m). The column decoder 20 decodes column addresses AC to drive corresponding bit lines BLj (note that j=1 to n). The word lines WLi and bit lines BLj are connected to a memory cell array 30.

As will be described herein below, insulated gate type field-effect transistor having a floating gate are disposed as memory cells MCi,j at each location of intersection between the word lines WLi and bit lines BLi in the memory cell array 30. The control gates of the memory cells MCi,j are connected to the word lines WLi. The sources are connected to source lines SLi provided in relation to the word lines WLi. The drains are connected to the bit lines BLj. The word lines WLi and source lines SLi are connected to a high voltage application decoder 40.

The high voltage application decoder 40 performs erase and rewrite disabling control in respect of the memory cells MCi,j inside the memory cell array 30 on the basis of security signals SEQi in word line WLi units set in a disablement information setting portion 60.

The disablement information setting portion 60 is constituted by conventional nonvolatile memory such as EEPROM and stores a set and reset state as the security signals SEQi. Following the storage of programs and fixed data in the memory cells MCi,j inside the memory cell array 30, the security signals SEQi in this disablement information setting portion 60 which correspond to the word lines WLi in the region which is to be rewrite-disabled are set to "L", and thus rewriting is disabled.

This nonvolatile memory also comprises a control portion 70 and a high voltage generating portion 80. The control portion 70 performs access control of the memory cell array 30 such as erase, write, and read control on the basis of the address signal AD, data DT, clock signals and so on. The control portion 70 outputs complementary enabling signals EN, ENHN to the row decoder 10 and outputs an enabling signal ENP to the high voltage generating portion 80.

To the high voltage application decoder 40, the control portion 70 also outputs complementary enabling signals EHV, EHVN for erase control, complementary enabling signals PHV, PHVN for write control, enabling signals ESET, SET for word line state latching, and a reset signal RST for resetting the latch.

The high voltage generating portion 80 is constituted by a charge pump, for example, and generates a high voltage VPP necessary for performing a write or erase operation in accordance with the enabling signal ENP. When the enabling signal ENP is not provided, the high voltage generating portion 80 generates a power supply voltage VDD, and when the enabling signal ENP is provided generates a high voltage VPP which is higher than this power supply voltage VDD. This high voltage VPP is outputted to the row decoder 10 and the high voltage application decoder 40.

Figure 2:
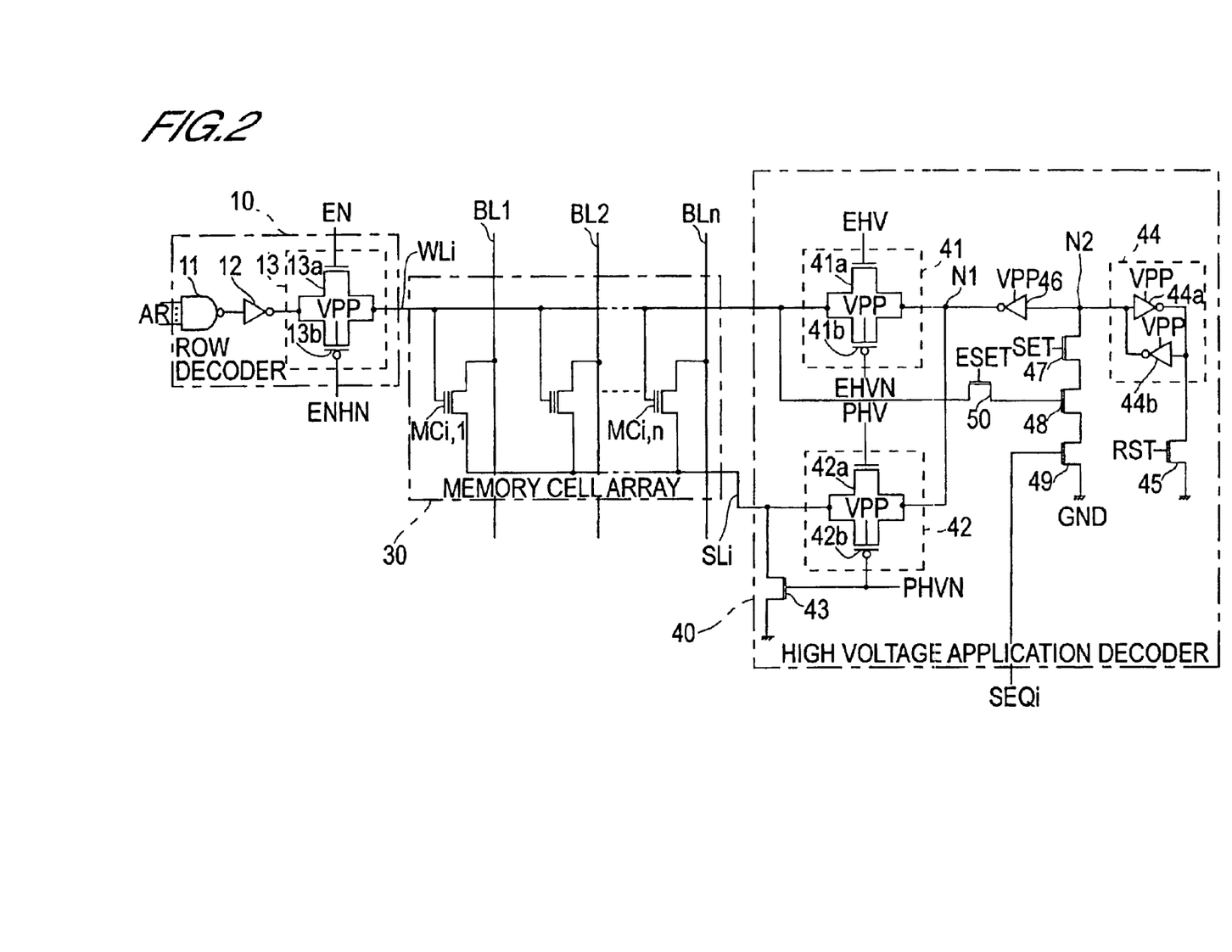
FIG. 2 is a circuit diagram corresponding to a word line in the nonvolatile memory of FIG. 1.

FIG. 2 is a circuit diagram corresponding to a word line WLi in the nonvolatile memory of FIG. 1.

The row decoder 10 comprises a logical gate 11 which decodes a row address AR to generate a selection signal for a word line WLi, a buffer 12 which power amplifies the output signal from the logical gate 11, and a switch 13 which controls the connection between the output side of the buffer 12 and the word line WLi. The switch 13 is constituted by a transfer gate in which an n-channel MOS transistor (to be referred to hereafter as "NMOS") 13a which is on/off controlled by the enabling signal EN and a p-channel MOS transistor (to be referred to hereafter as "PMOS") 13b which is on/off controlled by the enabling signal ENHN are connected in parallel. The substrate potential of the PMOS 13b is connected to the output side of the high voltage generating portion 80 and is provided with the high voltage VPP.

The memory cell array 30 is constituted by the disposition of memory cells MCi,j (note that j=1 to n) in each location of intersection between the word line WLi and bit lines BL1 to BLn. The control gates of the memory cells MCi,j are connected in common to the word line WLi, and the sources are connected in common to the source line SLi. The drains of the memory cells MCi,j are connected to the bit lines BLj.

During erasure, the drain and source of each memory cell MCi,j are connected to ground potential GND, for example, and the high voltage VPP is applied to the control gate. Thereby, the negative charge to the floating gate is removed such that the memory cells MCi,j enter an ON state, and thus stored data is erased in word line WLi units. During writing, the drain is set at ground potential GND, the control gate is set at "H" level, and the high voltage VPP is applied to the source. In so doing, a negative charge is accumulated in the floating gate such that the memory cells MCi,j enter an OFF state, whereupon writing is performed in units of the memory cells MCi,j specified by the word line WLi and bit lines BLj.

During reading, the control gate is set to "H" and the source is set to the ground potential GND, whereby the on/off state of each memory cell MCi,j is outputted to the drain. Thus the state of each memory cell MCi, 1 to MCi,n selected by the word line WLi can be read via the respective bit lines BL1 to BLn.

The high voltage application decoder 40 comprises switches 41, 42 corresponding to the word line WLi and the source line SLi. The switch 41 switches the connection between the word line WLi and a node N1 on and off in accordance with complementary enabling signals EHV, EHVN. The switch 41 is constituted by a transfer gate in which an NMOS 41a which is on/off controlled by the enabling signal EHV and a PMOS 41b which is on/off controlled by the enabling signal EHVN are connected in parallel. The substrate potential of the PMOS 41b is connected to the output side of the high voltage generating portion 80 and is provided with the high voltage VPP.

The switch 42 likewise switches the connection between the source line SLi and the node N1 on and off in accordance with complementary enabling signals PHV, PHVN. The switch 42 is constituted by a transfer gate comprising an NMOS 42a and a PMOS 42b. The substrate potential of this PMOS 42b is connected to the output side of the high voltage generating portion 80. The source line SLi is connected to the ground potential GND via an NMOS 43 which is on/off controlled by the enabling signal PHVN.

The high voltage application decoder 40 also comprises a latch 44 for storing a selected word line WLi. The latch 44 is constituted by two inverters 44a, 44b connected in a loop form and operates with the high voltage VPP supplied from the high voltage generating portion 80 as a power supply. The set terminal of the latch 44 is connected to a node N2 and the reset terminal is connected to the ground potential GND via an NMOS 45. A reset signal RST is provided to the gate of the NMOS 45.

The node N2 is connected to the node N1 via an inverter 46 which operates with the high voltage VPP supplied from the high voltage generating portion 80 as a power supply. The node N2 is also connected to the ground potential GND via NMOSs 47, 48, 49 which are connected in series. An enabling signal SET and the security signal SEQi are provided to the gates of the NMOSs 47, 49 respectively. Further, the gate of the NMOS 48 is connected to the word line WLi via an NMOS 50 which is on/off controlled by an enabling signal ESET.

Figure 3:
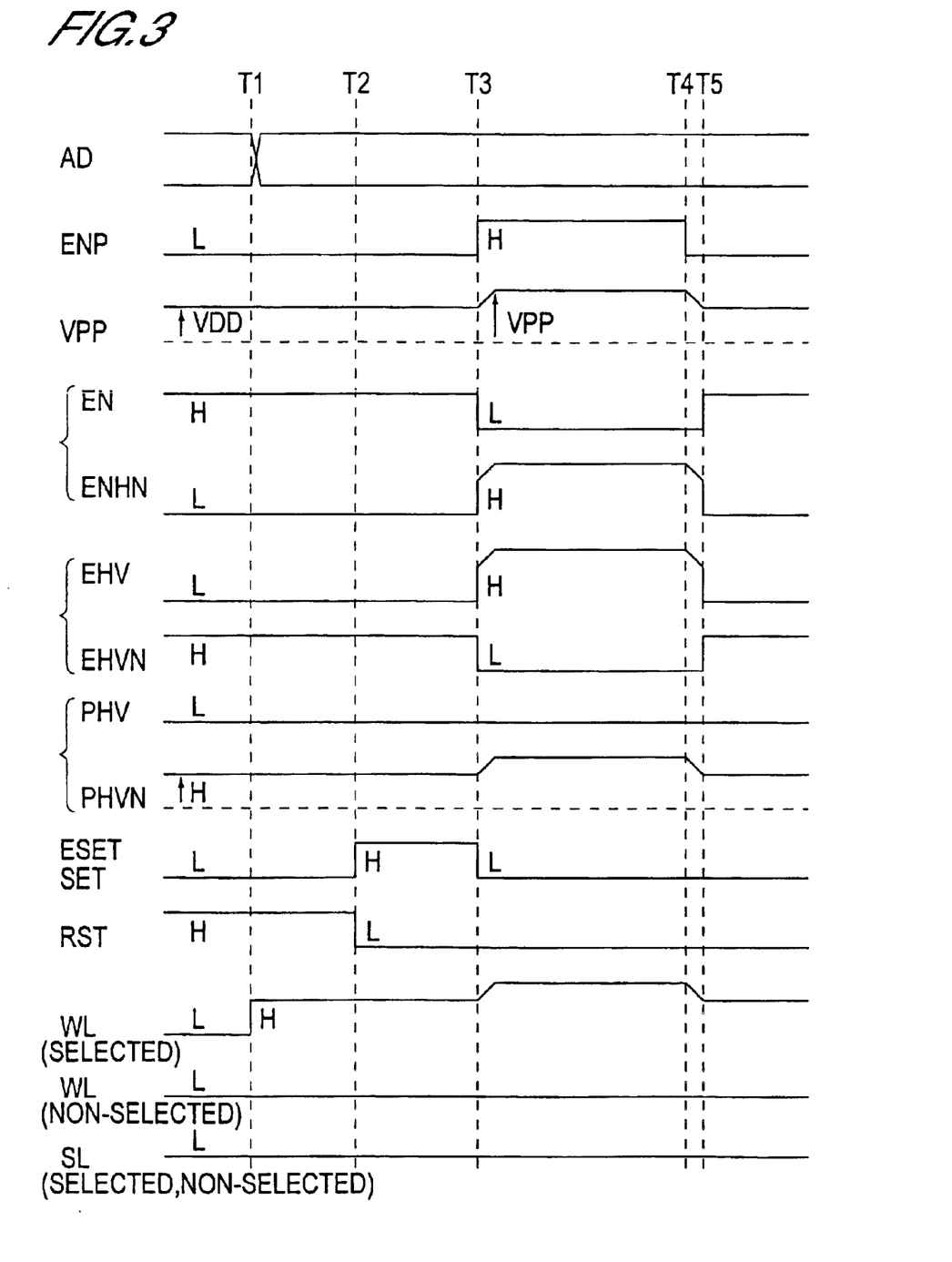
FIG. 3 is a timing chart illustrating operations during erasure in FIG. 2.
Figure 4:
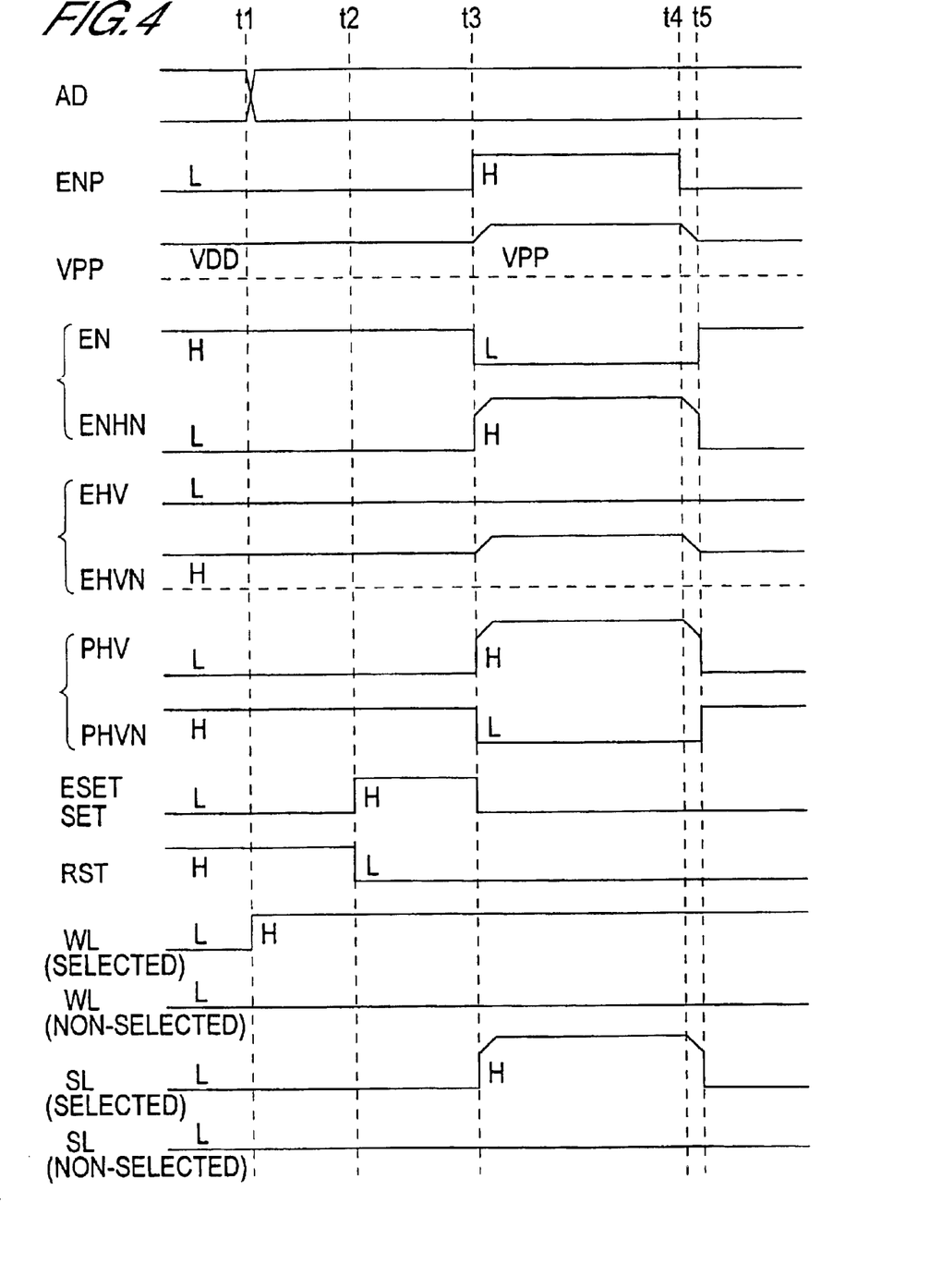
FIG. 4 is a timing chart illustrating operations during writing in FIG. 2.

FIGS. 3 and 4 are timing charts respectively showing operations during the erasure and writing of FIG. 2. The operations of FIG. 2 will now be described with reference to FIGS. 3 and 4 divided into (1) the operations during erasure and (2) the operations during writing. Note that programs and data are stored in the memory cell array 30 of FIG. 1, and rewrite disablement information corresponding to each word line WLi is set in the disablement information setting portion 60.

(1) Erase Operations

Excepting specific erase and write timing, the enabling signals EN, ENHN for the row decoder 10 are in an enabled state, and the enabling signals EHN, EHVN, the enabling signals PHN, PHVN, and the enabling signals ESET, SET for the high voltage application decoder 40 are in a disabled state.

When an address signal AD which specifies an address to be subject to erasure is inputted at time T1 in FIG. 3, the corresponding output signal of the logical gate 11 in the row decoder 10 becomes "L", the output signal of the buffer 12 becomes "H", and thus the word line WLi selected via the switch 13 becomes "H". Meanwhile, the unselected word lines WLi are "L". In the control portion 70, a sequence for performing an erase operation is begun on the basis of the address signal AD, data DT and so on, for example.

At time T2, the set signal RST outputted from the control portion 70 switches from "H" to "L" and the enabling signals ESET, SET switch from "L" to "H". As a result, the latch 44 is released from the reset state and the potential of the word line WLi is applied to the gate of the NMOS 48 via the NMOS 50. The NMOS 48 then switches on.

When a word line WLi is selected and the security signal SEQi is "H", the NMOSs 47 to 49 all switch on and the node N2 becomes "L", and this state is held in the latch 44. If a word line WLi is non-selected or the security signal SEQi is "L", the node N2 is maintained in an "H" state.

At time T3, the enabling signals ESET, SET switch to "L", the enabling signals EN, ENHN switch to a disabled state, the enabling signals EHV, EHVN switch to an enabled state, and the enabling signal ENP for the high voltage generating portion 80 becomes "H".

As a result, the switch 13 of the row decoder 10 switches off and the word line WLi is cut off from the row decoder 10. Meanwhile, the switch 41 of the high voltage application decoder 40 is switched on and the word line WLi is connected to the node N1. At this time, the switch 42 and NMOS 43 switch off and on respectively and the potential of the source line SLi is at ground potential GND whether selected or non-selected.

By means of an operation of the high voltage generating portion 80 in accordance with the enabling signal ENP, the voltage which is outputted from the high voltage generating portion 80 rises from the power supply voltage VDD to the high voltage VPP. As a result, if the node N2 is "L", the output voltage of the inverter 46 switches to the high voltage VPP and is applied to the word line WLi via the switch 41. The stored content of the memory cells MCi, 1 to MCi,n which are connected to the selected word line WLi is then erased en masse.

On the other hand, for word lines WLi which are not selected or in which the security signal SEQi is "L", the node N2 is "H". Thus the output voltage of the inverter 46 is "L" and the stored content of the memory cells MCi, 1 to MCi, nwhich are connected to these word lines WLi does not alter.

At time T4, the enabling signal ENP for the high voltage generating portion 80 becomes "L" and the voltage which is outputted from the high voltage generating portion 80 returns to the power supply voltage VDD from the high voltage VPP.

At time T5, the enabling signals EN, ENHN become enabled and the enabling signals EHV, EHVN become disabled, thereby returning to their original states.

(2) Write Operations

At the times t1 to t2 in FIG. 4, the write operations occurring at these times t1 to t2 are identical to the erase operations at times T1 to T2.

At time t3 in FIG. 4, the enabling signals ESET, SET switch to "L", the enabling signals EN, ENHN become disabled, the enabling signals PHV, PHVN become enabled, and the enabling signal ENP for the high voltage generating portion 80 becomes "H".

As a result, the switch 13 of the row decoder 10 switches off and the word line WLi is cut off from the row decoder 10. Meanwhile, the switch 42 and NMOS 43 of the high voltage application decoder 40 respectively switch on and off such that the source line SLi is connected to the node N1. At this time, the switch 41 is off.

By means of an operation of the high voltage generating portion 80 in accordance with the enabling signal ENP, the voltage which is outputted from the high voltage generating portion 80 rises to the high voltage VPP. Accordingly, if the node N2 is "L", the output voltage of the inverter 46 shifts to the high voltage VPP and this voltage is applied to the source line SLi via the switch 42. The memory cells MCi, 1 to MCi, nwhich are connected to the selected source line SLi are then written to in accordance with the states of the respective bit lines BL1 to BLn.

On the other hand, for word lines WLi which are not selected or in which the security signal SEQi is "L", the node N2 is "H". Thus the output voltage of the inverter 46 is "L" and the stored content of the memory cells MCi, 1 to MCi, nwhich are connected to these word lines WLi does not alter.

At time t4, the enabling signal ENP becomes "L" and the voltage which is outputted from the high voltage generating portion 80 returns to the power supply voltage VDD from the high voltage VPP.

At time t5, the enabling signals EN, ENHN become enabled and the enabling signals PHV, PHVN become disabled, thereby returning to their original states.

A detailed description of the operations during erasure and writing was provided above. During reading, on the other hand, the enabling signals EHV, EHVN, PHV, PHVN are set to a disabled state. The high voltage application decoder 40 is then cut off from the word line WLi and source line SLi and the source line SLi is set at ground potential GND, whereupon a normal read operation is performed.

As described above, the nonvolatile memory of this first embodiment comprises a latch 44 which holds the word line WLi selection state. The nonvolatile memory also comprises a high voltage application decoder 40 having switches 41, 42 which control the output of a high voltage VPP for erasure and rewriting on the basis of the state held in the latch 44 and the security signal SEQi which is applied in word line WLi units. As a result, an advantage is gained in that a rewrite-disabled region can be set freely in word line WLi units.

Second Embodiment

Figure 5:
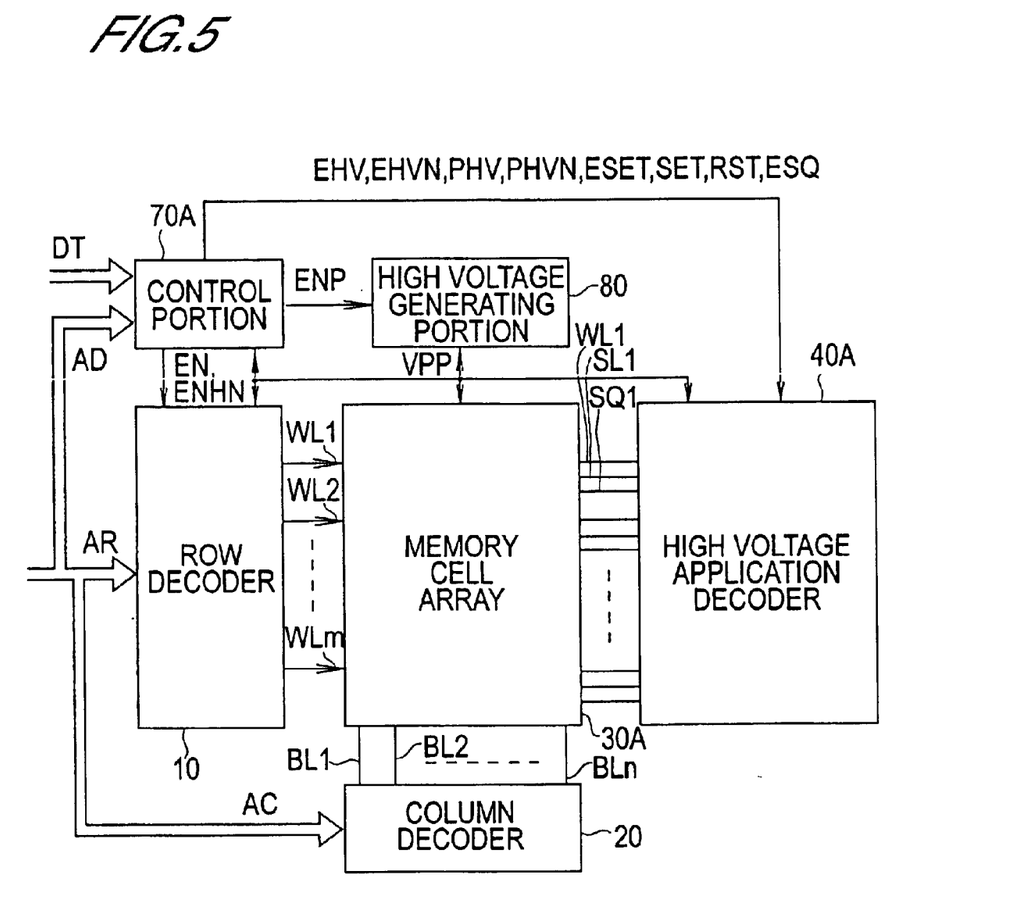
FIG. 5 is a block diagram of nonvolatile memory relating to a description of a second embodiment.

FIG. 5 is a block diagram showing in outline nonvoltaile memory in a second embodiment of the present invention. Elements in common with the elements in FIG. 1 have been allocated identical reference numerals.

Figure 6:
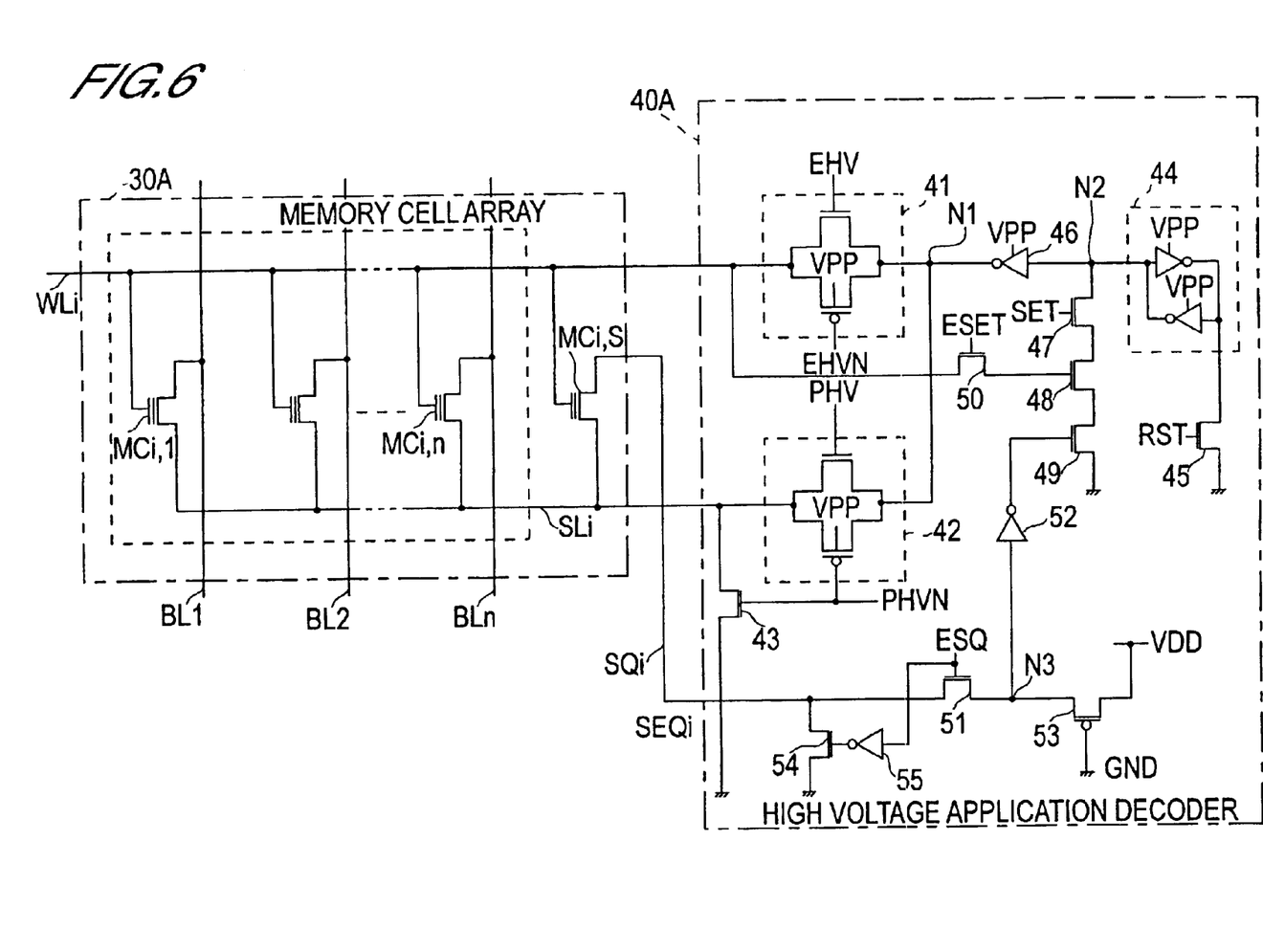
FIG. 6 is a circuit diagram corresponding to a word line in the nonvolatile memory of FIG. 5.

This nonvolatile memory is provided with a memory cell array 30A in which the disablement information setting portion 60 and the memory cell array 30 of FIG. 1 are combined, and is provided with a high voltage application decoder 40A and a control portion 70A with functions added in relation thereto. FIG. 6 is a circuit diagram corresponding to a word line WLi of the nonvolatile memory of FIG. 5.

The memory cell array 30A is provided with a security memory cell MCi,s in addition to the memory cells MCi, 1 to MCi, nwhich, similarly to those in FIG. 2, correspond to the bit lines BL1 to BLn. The memory cell MCi, s is constituted similarly to the memory cells MCi, 1 to MCi, nby an insulated gate type field-effect transistor having a floating gate, the control gate and source thereof being connected to the word line WLi and source line SLi respectively. The drain thereof is connected to a security line SQi such that the stored content of the memory cell MCi, s is outputted to the security line SQi as a security signal SEQi.

The high voltage application decoder 40A is constituted by the addition of NMOSs 51, 54, inverters 52, 55, and a PMOS 53 to the high voltage application decoder 40 illustrated in FIG. 2. The security line SQi of the memory cell array 30A is provided to a node N3 via the NMOS 51. The gate of the NMOS 51 is provided with an enabling signal ESQ from the control portion 70A and is on/off controlled by this enabling signal ESQ.

The node N3 is connected to the gate of the NMOS 49 via the inverter 52 and is connected to the power supply voltage VDD via a pull-up PMOS 53 which is set to ON. The security line SQi is also connected to the ground potential GND via the NMOS 54, and the enabling signal ESQ is provided to the gate of this NMOS 54 via the inverter 55. The constitutions other than these points is identical to that illustrated in FIG. 2.

Figure 7:
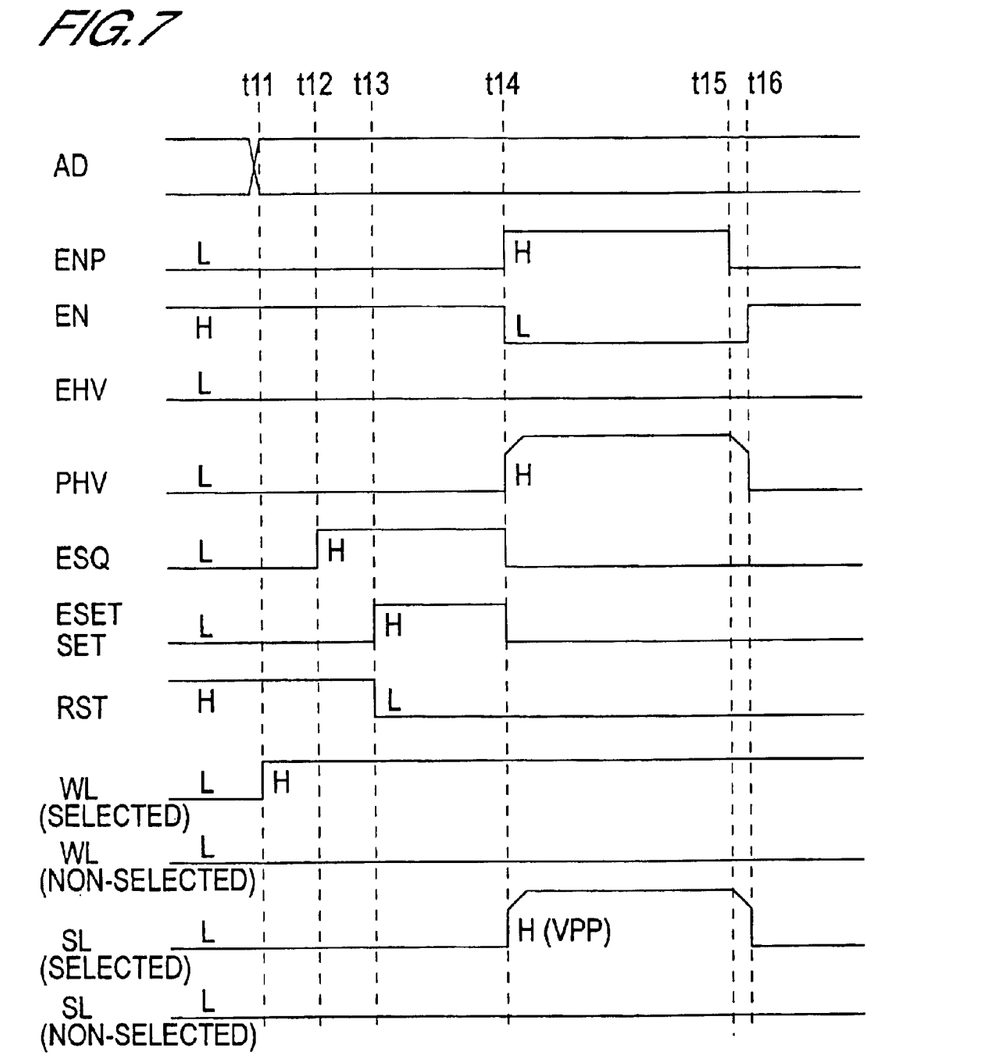
FIG. 7 is a timing chart illustrating operations during writing in FIG. 6.
Figure 8:
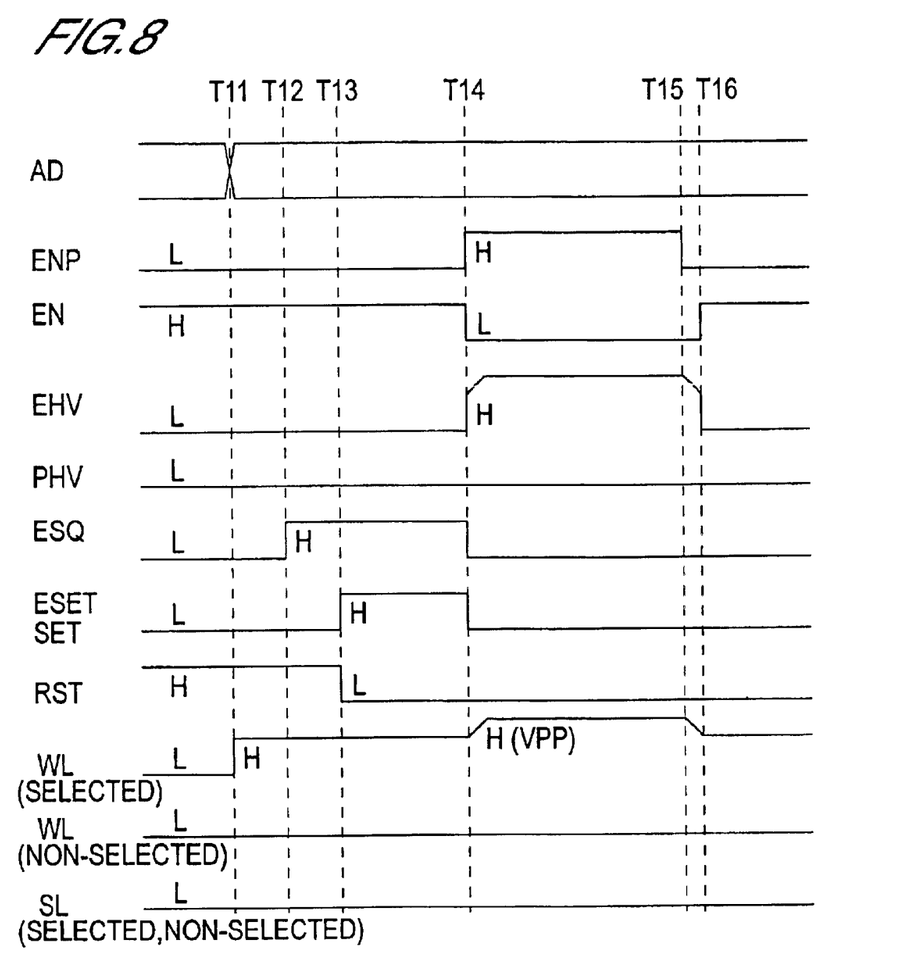
FIG. 8 is a timing chart illustrating operations during erasure in FIG. 6.

FIGS. 7 and 8 are timing charts for respectively describing the write and erase operations of FIG. 6. The operations of FIG. 6 will now be described with reference to FIGS. 7 and 8 divided into (1) security information writing, (2) the operations during erasure, and (3) the operations during writing. Note that programs and data are stored in the memory cells MCi, 1 to MCi, nin FIG. 6, and that the security memory cell MCi, s is in an erased state.

(1) Security Information Writing

When an address signal AD specifying an address which is to be subject to writing is inputted at time t11 in FIG. 7, the selected word line WLi becomes "H" and the unselected word lines WLi become "L". Further, in the control portion 70A, a sequence for performing a write operation is begun on the basis of the address signal AD, data DT and so on, for example.

At time t12, the enabling signal ESQ which is outputted from the control portion 70A becomes "H" such that the security line SQi is connected to the node N3 via the NMOS 51. At this time, the security memory cell MCi, s is in an erased state and an ON state, and therefore the node N3 becomes "L" and "H" is applied to the gate of the NMOS 49.

At time t13, the reset signal RST outputted from the control portion 70A switches to "L" and the enabling signals ESET, SET switch to "H". As a result, the latch 44 is released from a reset state and the potential of the word line WLi is applied to the gate of the NMOS 48 via the NMOS 50. Further, the NMOS 47 switches on. Since the word line WLi is selected and switched to "H", all of the NMOSs 47 through 49 switch on, the node N2 becomes "L", and this state is held in the latch 44. Meanwhile, the non-selected word lines WLi are "L", and hence the node N2 is maintained in an "H" state.

At time t14, the enabling signals ESET, SET and the enabling signal ESQ switch to "L". The enabling signals EN, ENHN become disabled, the enabling signals PHV, PHVN become enabled, and the enabling signal ENP for the high voltage generating portion 80 becomes "H".

As a result, the word line WLi is cut off from the row decoder 10. Meanwhile, the switch 42 and NMOS 43 of the high voltage application decoder 40A switch on and off respectively such that the source line SLi is connected to the node N1. Further, the NMOS 54 switches on such that the security line SQi switches to ground potential GND.

The voltage outputted from the high voltage generating portion 80 rises from the power supply voltage VDD to the high voltage VPP by means of the enabling signal ENP. The node N2 which corresponds to the memory cell MCi, s subject to writing is "L", and therefore the output voltage of the inverter 46 becomes the high voltage VPP and is applied to the source line SLi via the switch 42. As a result, the memory cell MCi, s subject to writing is written to.

In the unselected word lines WLi, on the other hand, the node N2 is "H", and therefore the output voltage of the inverter 46 is "L" and the memory cells MCi, s which are connected to these word lines WLi are not written to.

At time t15, the enabling signal ENP becomes "L", and the voltage outputted from the high voltage generating portion 80 switches back to the power supply voltage VDD from the high voltage VPP.

At time t16, the enabling signals EN, ENHN become enabled and the enabling signals PHV, PHVN become disabled, thus returning to their original states.

Thus word lines WLi which are to be rewrite disabled are selected in succession and security information can be set by writing to the security memory cells MCi, s which are connected to these word lines WLi.

(2) Erase Operations

When an address signal AD specifying an address which is to be subject to erasure is inputted at time T11 in FIG. 8, the selected word line WLi becomes "H" and the unselected word lines WLi become "L".

At time T12, the enabling signal ESQ becomes "H" such that the security line SQi is connected to the node N3 via the NMOS 51. If the security memory cell MCi, s has been erased to thereby enter an ON state (if the security signal SEQi is "L"), the node N3 becomes "L" and "H" is applied to gate of the NMOS 49. If the memory cell MCi, s has been written to and has entered an OFF state (if the security signal SEQi is "H"), the node N3 becomes "H" and "L" is applied to the gate of the NMOS 49.

At time T13, the reset signal RST outputted from the control portion 70A switches to "L" and the enabling signals ESET, SET switch to "H". As a result, the latch 44 is released from the reset state and the potential of the word line WLi is applied to the gate of the NMOS 48 via the NMOS 50. Further, the NMOS 47 enters an ON state. Since the selected word line WLi is "H", if the security signal SEQi is "L", all of the NMOSs 47 through 49 switch on and the node N2 becomes "L", and this state is held in the latch 44. For the non-selected word lines WLi, or when the security signal SEQi are "H", on the other hand, the node N2 is maintained in an "H" state.

At time T14, the enabling signals ESET, SET, and the enabling signal ESQ switch to "L". The enabling signals EN, ENHN become disabled, the enabling signals EHV, EHVN become enabled, and the enabling signal ENP for the high voltage generating portion 80 becomes "H".

As a result, the word line WLi is cut off from the row decoder 10 and connected to the node N1.

The voltage outputted from the high voltage generating portion 80 rises to the high voltage VPP from the power supply voltage VDD by means of the enabling signal ENP. The node N2 corresponding to the word line WLi which is subject to erasure is "L", and therefore the output voltage of the inverter 46 becomes the high voltage VPP and is applied to the word line WLi via the switch 41. Thus the memory cell MCi, s which is subject to writing is erased.

In the unselected word lines WLi, on the other hand, the node N2 is "H", and therefore the output voltage of the inverter 46 is "L" and the memory cells MCi, s which are connected to these word lines WLi are not erased.

At time T15, the enabling signal ENP becomes "L" such that the voltage outputted from the high voltage generating portion 80 switches back to the power supply voltage VDD from the high voltage VPP.

At time T16, the enabling signals EN, ENHN become enabled and the enabling signals EHV, EHVN become disabled, thus returning to their original states.

(3) Write Operations

The write operations for the memory cells MCi, 1 to MCi,n in the memory cell array 30A are substantially identical to the security information write operations. Note, however, that during security information writing the security memory cell MCi, s is on, but following completion of security information writing this security memory cell MCi, s is written to in an OFF state in accordance with the disabled state. Accordingly, writing is determined by the state of the security memory cell MCi, s corresponding to the selected word line WLi. All other operations are identical to the security information writing operations.

As described above, the nonvolatile memory of this second embodiment comprises a memory cell MCi, s for storing security information within the memory cell array 30A. As a result, the circuit constitution can be simplified, and since erase and write operations are impossible in respect of the memory cell MCi, s once the memory cell MCi s has been written to, an advantage is gained in that security can be further enhanced.

Third Embodiment

Figure 9:
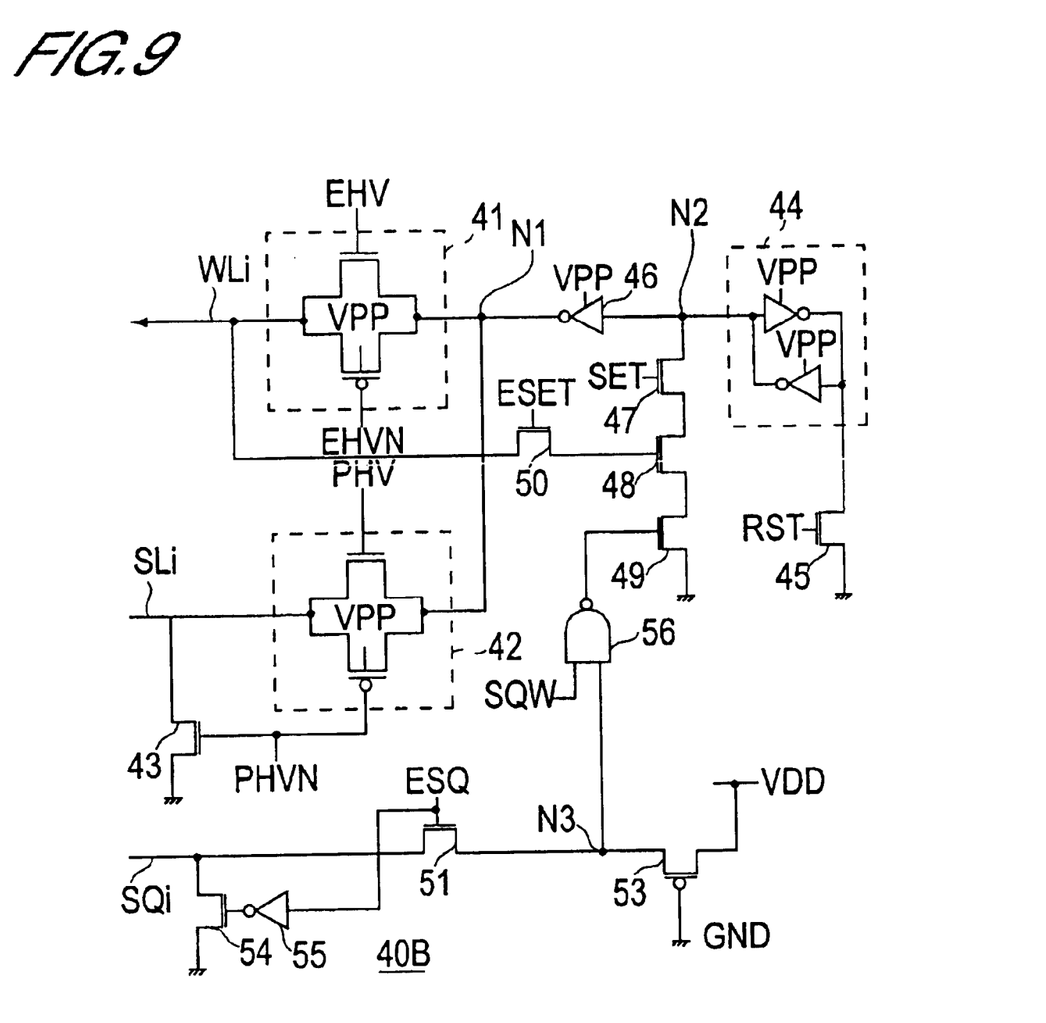
FIG. 9 is a circuit diagram of a high voltage application decoder of a third embodiment.

FIG. 9 is a circuit diagram illustrating a high voltage application decoder in a third embodiment of the present invention. Elements in common with the elements in FIG. 6 have been allocated identical reference numerals.

This high voltage application decoder 40B is provided with a two-input not-and gate (to be referred to hereafter as "NAND") 56 in place of the inverter 52 of the high voltage application decoder 40A in FIG. 6. The first input side of the NAND 56 is connected to the node N3 and the second input side is provided with a security write signal SQW from the control portion 70, for example. Otherwise, the constitution is identical to FIG. 6.

By setting the security writing signal SQW to "L" in this type of high voltage application decoder 40B, the security memory cell MCi, s in the memory cell array 30A may be accessed. As a result, security information which is set in the memory cell MCi, s may be rewritten.

As described above, the high voltage application decoder of this third embodiment comprises a NAND 56 which provides the memory cell MCi, s for storing security information with a security writing signal SQW for releasing an access disabled state. Thereby, advantages are gained in that the circuit constitution can be simplified and a rewrite-disabled region can be set freely.

Note that the present invention is not limited to the aforementioned embodiments and may undergo various modifications. The following are examples of such modifications.

(a) Erase, write, and read operations in respect of the memory cells MCi, j are not limited to the illustrated examples.

(b) The constitution of the latch 44 in the high voltage application decoder 40 and the circuit constitution for setting and resetting this latch 44 are not limited to those illustrated. For example, a set/reset type flip-flop may be used in place of the inverter-combined latch 44. Further, an AND gate or the like may be used in the setting circuit.

What is claimed is:

1. A nonvolatile memory comprising:
   a decoding circuit for selecting one of a plurality of word lines by decoding an address signal;
   a memory cell array provided with nonvolatile memory cells in each location of intersection between said plurality of word lines and intersecting bit lines for holding storage data by electrical charge accumulated in a floating gate;
   a high voltage application circuit for supplying a high voltage during rewriting of the stored data in the nonvolatile memory cells; and
   a storage circuit for storing set information for each of said plurality of word lines indicative of whether or not the nonvolatile memory cells which are connected to each of the word lines may be rewritten,
   said high voltage application circuit comprising
      a latch portion for holding information for each of said plurality of word lines indicative of whether or not the nonvolatile memory cells which are connected to each of the word lines are to be rewritten,
      a setting portion, wherein when a selection signal is outputted from said decoding circuit to a word line for which set information indicating that rewriting is permissible has been set in said storage circuit, sets the information in the latch portion which corresponds to the word line, and when a security write signal is applied, the information is settable in the latch portion corresponding to the word line selected in said decoding circuit regardless of the set information in said storage circuit, and
      an output portion for supplying a high voltage to the nonvolatile memory cells connected to said word line in accordance with the information held in said latch portion during rewriting of said nonvolatile memory cells.

2. The nonvolatile memory according to claim 1, wherein said storage circuit comprises nonvolatile memory cells in the memory cell array which hold said set information by electrical charge accumulated in floating gates disposed for each of said plurality of word lines, whereby said storage circuit is rewritable in a similar manner as said memory cell array.

3. A nonvolatile memory comprising:
   a decoding circuit for selecting one of a plurality of word lines by decoding an address signal;
   a memory cell array in which first nonvolatile memory cells constituted by insulated gate type field-effect transistors are disposed in locations of intersection between said plurality of word lines, a plurality of source lines disposed in relation to the word lines, and bit lines which intersect the word lines and the source lines, for holding storage data by electrical charge accumulated in a floating gate, and in which control gates, sources and drains of the first nonvolatile memory cells are respectively connected to corresponding word lines, source lines, and bit lines;
   a storage circuit comprising second nonvolatile memory cells constituted by insulated gate type field-effect transistors used for holding information regarding rewritability by electrical charge accumulated in a floating gate, said second nonvolatile memory cells being provided for each of said plurality of word lines, control gates and sources thereof being respectively connected to corresponding word lines and source lines, and drains thereof being connected to security lines provided in relation to said word lines;
   a first switch provided for each of said word lines for on/off controlling connection between each word line and an output node corresponding to each word line responsive to an erase enabling signal;
   a second switch provided for each of said source lines for on/off controlling connection between each source line and said output node corresponding to each source line responsive to a write enabling signal;
   a latch circuit provided in relation to each of said word lines for holding rewrite information concerning each of said word lines;
   a reset circuit for resetting said latch circuit in accordance with a reset signal;
   a setting circuit, wherein when a setting signal is applied and when information indicating that a word line selected by said decoding circuit may be rewritten is held in the second nonvolatile memory cells of said storage circuit corresponding to the word line, sets the latch circuit which corresponds to the word line; and
   a high voltage outputting circuit which outputs a high voltage for erasure or writing to said output node corresponding to the word line for which said latch circuit is sets, when said erase enabling signal or said write enabling signal is applied.

4. A nonvolatile memory comprising:
   a decoder that decodes an address to select one of a plurality of word lines;
   a memory cell array provided with memory cells at intersections between bit lines and the word lines, a plurality of source lines being respectively provided as corresponding to the word lines,
   each memory cell having a control gate connected to a respective word line, a drain connected to a respective bit line and a source connected to a respective source line;
   a disablement information setting portion that stores rewrite information indicative of rewritability of each of the word lines; and
   a high voltage output circuit that outputs a high voltage to the selected word line for erasure upon receipt of an erase enable signal, and that outputs the high voltage to the source line that corresponds to the selected word line for writing upon receipt of a write enable signal, responsive to the rewrite information stored in said disablement information setting portion for the selected word line.

5. The nonvolatile memory of claim 4, wherein said disablement information setting portion comprises second memory cells in said memory cell array, whereby the information stored in said disablement information setting portion is rewritable.

6. The nonvolatile memory of claim 4, wherein said disablement information setting portion is an EEPROM coupled to said high voltage output circuit, wherein the information is stored in the EEPROM as security signals.

7. The nonvolatile memory of claim 4, wherein said high voltage output circuit comprises:
- a latch that holds a first logic level if the selected word line is rewritable and a second logic level if the selected word line is non-rewritable;
- a setting portion that sets said latch to hold the first logic level or the second logic level, responsive to the rewrite information, upon receipt of a selection signal indicative that the selected word line has been selected by said decoder; and
- an output portion, coupled to receive the erase enable signal and the write enable signal, that selectively outputs the high voltage to either the selected word line or to the source line corresponding to the selected word line, if the first logic level is held in said latch.

8. The nonvolatile memory of claim 7, wherein said output portion comprises:
- an inverter, coupled to said latch, that provides the high voltage when the first logic level is held is said latch;
- a first switch, coupled to said inverter, that outputs the high voltage from said inverter to the selected word line upon receipt of the erase enable signal; and
- a second switch, coupled to said inverter, that outputs the high voltage from said inverter to the source line corresponding to the selected word line upon receipt of the write enable signal.

9. The nonvolatile memory of claim 4, wherein the memory cells comprise insulated gate type field effect transistors with floating gates for data storage.

* * * * *